(12) United States Patent
Ishibashi et al.

(10) Patent No.: US 12,729,426 B2
(45) Date of Patent: Sep. 8, 2026

(54) FILM FORMING METHOD AND FILM FORMING APPARATUS

(71) Applicant: TOKYO ELECTRON LIMITED, Tokyo (JP)

(72) Inventors: Shota Ishibashi, Yamanashi (JP); Toru Kitada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/076,164

(22) Filed: Dec. 6, 2022

(65) Prior Publication Data

US 2023/0175112 A1 Jun. 8, 2023

(30) Foreign Application Priority Data

Dec. 7, 2021 (JP) ................................ 2021-198557

(51) Int. Cl.
*C23C 14/54* (2006.01)
*C23C 14/08* (2006.01)
(Continued)

(52) U.S. Cl.
CPC .......... *C23C 14/548* (2013.01); *C23C 14/086* (2013.01); *C23C 14/14* (2013.01);
(Continued)

(58) Field of Classification Search
CPC ..... C23C 14/54; C23C 14/548; C23C 14/352; C23C 14/50; C23C 14/351; C23C 14/3407; C23C 14/14; C23C 14/086; C23C 14/3492; C23C 14/35; C23C 14/542; C23C 14/04; C23C 14/22; C23C 14/225;
(Continued)

(56) References Cited

U.S. PATENT DOCUMENTS 5,565,071 A * 10/1996 Demaray ............ H01J 37/3497
204/192.12
6,033,536 A 3/2000 Ichihara et al.
(Continued)

FOREIGN PATENT DOCUMENTS

| | | | |
|---|---|---|---|
| JP | H08-311642 | A | 11/1996 |
| JP | 2000303172 | A * | 10/2000 |
| JP | 2007-302912 | A | 11/2007 |
| JP | 5587822 | B2 | 9/2014 |
| JP | 2021-109995 | A | 8/2021 |
| WO | WO 2007/066511 | A1 | 6/2007 |

*Primary Examiner* — Michael A Band
(74) *Attorney, Agent, or Firm* — Fenwick & West LLP

(57) ABSTRACT

There is a method for forming a film including an alloy film containing multiple types of elements on a surface of a substrate using a film forming target made of the alloy film, comprising: (a) arranging the film forming target and a distribution improvement target; and (b) forming the film on the substrate by simultaneously or alternately sputtering the film forming target and the distribution improvement target, wherein the distribution improvement target is made of a distribution improvement film containing a non-uniform element among the multiple types of elements, and in step (b), a larger amount of the non-uniform element sputtered from the distribution improvement target is supplied to a portion where the distribution amount of the non-uniform element is small compared to a portion where the distribution amount of the non-uniform element is large when the film is formed on the substrate by the film forming target.

7 Claims, 15 Drawing Sheets

(51) Int. Cl.
*C23C 14/14* (2006.01)
*C23C 14/34* (2006.01)
*C23C 14/35* (2006.01)
*H01J 37/34* (2006.01)

(52) U.S. Cl.
CPC .......... *C23C 14/3492* (2013.01); *C23C 14/35* (2013.01); *C23C 14/352* (2013.01); *C23C 14/54* (2013.01); *H01J 37/3455* (2013.01); *H01J 37/3464* (2013.01)

(58) Field of Classification Search
CPC .............. C23C 14/3464; H01J 37/3455; H01J 37/3464; H01J 37/3417; H01J 37/347; H01J 37/3473
See application file for complete search history.

(56) References Cited

U.S. PATENT DOCUMENTS

| | | | | |
|---|---|---|---|---|
| 6,770,353 | B1 * | 8/2004 | Mardilovich | H01M 8/1286 428/209 |
| 6,911,129 | B1 * | 6/2005 | Li | C23C 16/042 118/721 |
| 7,513,982 | B2 * | 4/2009 | Tepman | C23C 14/35 204/298.22 |
| 2017/0044659 | A1 * | 2/2017 | Sun | C23C 14/35 |

* cited by examiner

T(Tns)
T2
131
171
171T2
V
V
IV
121
131
171T1
171
171b
171a
S
N
Ax
S
N
131
171T3
171
T1
T(Ts)
T3
T(Tns)
IV
ic
S
N
T(Tns)
T4
131
171
171T4

FIG. 18

FILM FORMING METHOD AND FILM FORMING APPARATUS

CROSS-REFERENCE TO RELATED APPLICATIONS

This application claims priority to Japanese Patent Application No. 2021-198557 filed on Dec. 7, 2021, the entire contents of which are incorporated herein by reference.

TECHNICAL FIELD

The present disclosure relates to a film forming method and a film forming apparatus.

BACKGROUND

For example, Japanese Laid-open Patent Publication No. 2021-109995 discloses a film forming apparatus that prevents a non-uniform coating amount at a peripheral portion of a substrate in sputtering. International Patent Publication No. WO 2007-066511 discloses a film forming apparatus and a film forming method capable of improving uniformity of film quality and improving productivity. Japanese Patent No. 5587822 discloses a sputtering apparatus capable of forming a film having excellent in-plane distribution uniformity of a film thickness or a composition.

SUMMARY

The present disclosure provides a film forming method and a film forming apparatus capable of achieving uniform in-plane distribution of multiple elements contained in an alloy target.

In accordance with an aspect of the present disclosure, there is a film forming method for forming a film including an alloy film containing multiple types of elements on a surface of a substrate using a film forming target made of the alloy film, comprising: (a) arranging the film forming target and a distribution improvement target to face the substrate; and (b) forming the film on the substrate by simultaneously or alternately sputtering the film forming target and the distribution improvement target, wherein the distribution improvement target is formed of a distribution improvement film containing a non-uniform element, whose distribution on the surface of the substrate is non-uniform when the film is formed on the substrate by the film forming target, among the multiple types of elements, and in the step (b), a larger amount of the non-uniform element sputtered from the distribution improvement target is supplied from the distribution improvement target to a portion where the distribution amount of the non-uniform element is small compared to a portion where the distribution amount of the non-uniform element is large when the film is formed on the substrate by the film forming target.

BRIEF DESCRIPTION OF THE DRAWINGS

The objects and features of the present disclosure will become apparent from the following description of embodiments, given in conjunction with the accompanying drawings, in which:

FIGS. 18 and 19 explain a sixth distribution improvement method in an example of the film forming apparatus according to the embodiment.

DETAILED DESCRIPTION

Figure 1:
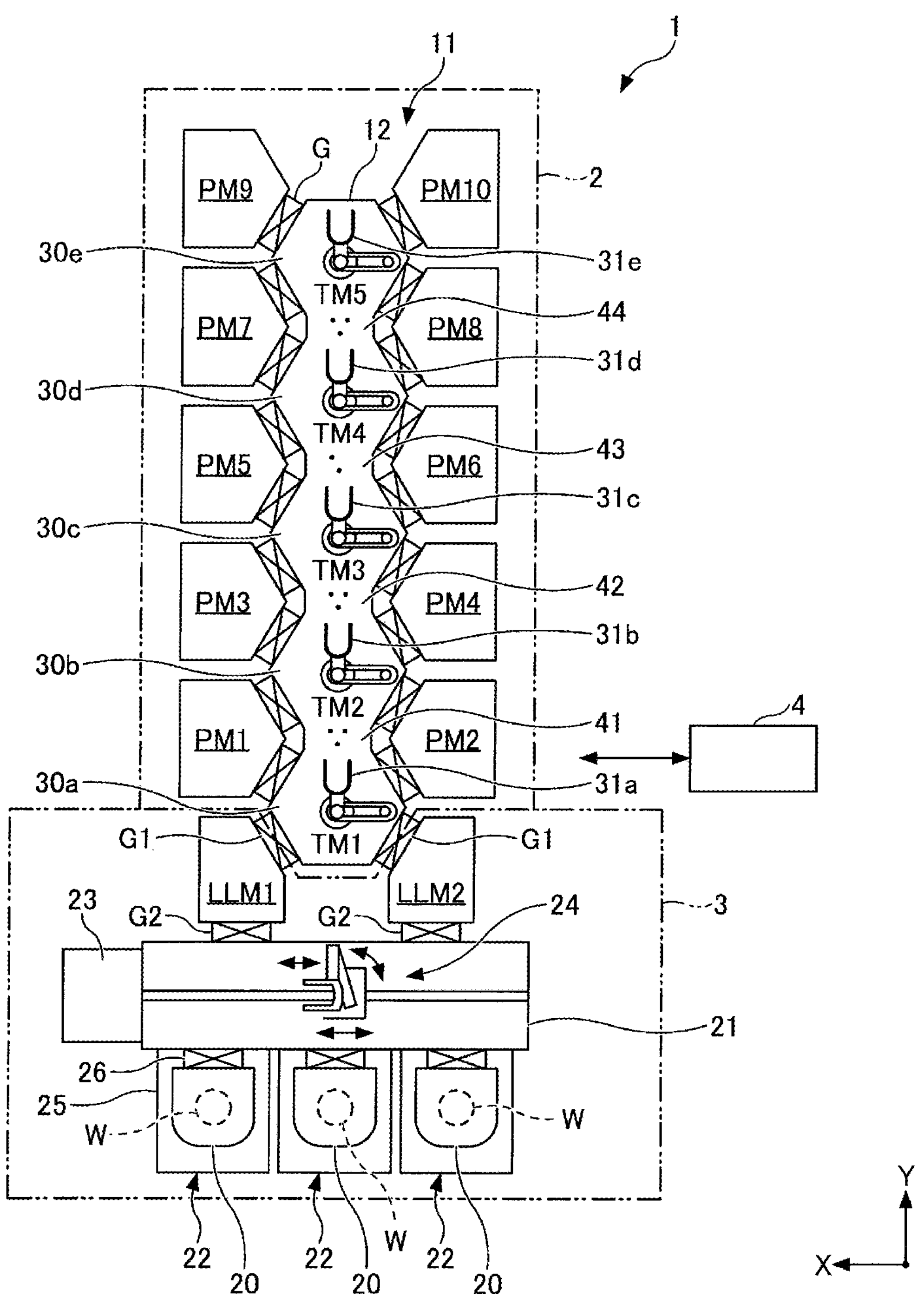
FIG. 1 is a schematic cross-sectional view of an example of a semiconductor manufacturing apparatus according to an embodiment.

Hereinafter, embodiments of the present disclosure will be described with reference to the accompanying drawings. Like reference numerals will be given to substantially like parts throughout the drawings and the specification, and redundant description thereof will be omitted.

Directions such as parallel, right-angled, orthogonal, horizontal, vertical, up and down, and left and right are allowed to deviate without spoiling the effect of the embodiment. The shape of a corner is not limited to a right angle, and may be rounded in an arc shape. The terms “parallel”, “right angled”, “orthogonal”, “horizontal”, and “vertical” may include “substantially parallel”, “substantially right angled”, “substantially orthogonal”, “substantially horizontal”, and “substantially vertical.”

<Semiconductor Manufacturing Apparatus 1>

FIG. 1 is a schematic cross-sectional view of a semiconductor manufacturing apparatus 1 that is an example of a semiconductor manufacturing apparatus according to an embodiment. The semiconductor manufacturing apparatus 1 performs a plurality of processes, e.g., desired processes such as etching, film formation, ashing, and the like, on a substrate W. The semiconductor manufacturing apparatus 1 includes a processing part 2, a loading/unloading part 3, and a controller 4. The substrate W is not particularly limited, but is a semiconductor wafer, for example. Hereinafter, the semiconductor wafer may be simply referred to as "wafer."

The loading/unloading part 3 loads/unloads a substrate, e.g., a wafer, to/from the processing part 2. The processing part 2 includes a plurality of process modules for performing desired vacuum processing on wafers. The processing part 2 of the present embodiment includes ten process modules PM1 to PM10. The wafer is serially transferred (sequentially transferred) to the process modules PM1 to PM10 by a first transfer device 11.

The first transfer device 11 includes a plurality of transfer modules TM1 to TM5. The transfer modules TM1 to TM5 have containers 30*a*, 30*b*, 30*c*, 30*d*, and 30*e* having a hexagonal planar shape and maintained in a vacuum state, respectively. Further, the transfer modules TM1 to TM5 have multi joint transfer mechanisms 31*a*, 31*b*, 31*c*, 31*d* and 31*e* disposed in the containers 30*a*, 30*b*, 30*c*, 30*d* and 30*e*, respectively.

Delivery parts 41, 42, 43 and 44 as transfer buffers are disposed between the transfer mechanism 31*a* of the transfer module TM1 and the transfer mechanism 31*b* of the transfer module TM2, between the transfer mechanism 31*b* of the transfer module TM2 and the transfer mechanism 31*c* of the transfer module TM3, between the transfer mechanism 31*c* of the transfer module TM3 and the transfer mechanism 31*d* of the transfer module TM4, between the transfer mechanism 31*d* of the transfer module TM4 and the transfer mechanism 31*e* of the transfer modules TM5, respectively. The containers 30*a*, 30*b*, 30*c*, 30*d* and 30*e* of the transfer modules TM1 to TM5 communicate with each other to form one transfer chamber 12.

The transfer chamber 12 extends in the Y direction in the drawing. Five of the process modules PM1 to PM10 are connected to one side of the transfer chamber 12 through gate valves G that can be opened and closed, other five process modules are connected to another side of the transfer chamber 12 through gate valves G that can be opened and closed. The gate valves G of the process modules PM1 to PM10 are opened when the transfer modules TM1 to TM5 access the process modules PM1 to PM10, and are closed during desired processing.

The loading/unloading part 3 is connected to one end of the processing part 2. The loading/unloading part 3 includes an atmospheric transfer chamber 21, three load ports 22, an aligner module 23, two load-lock modules LLM1 and LLM2, and a second transfer device 24. The load ports 22, the aligner module 23, and the load-lock modules LLM1 and LLM2 are connected to the atmospheric transfer chamber 21. Further, the second transfer device 24 is disposed in the atmospheric transfer chamber 21.

The atmospheric transfer chamber 21 has a rectangular parallelepiped shape with the X direction as a longitudinal direction in the drawing. The three load ports 22 are disposed at a long sidewall of the atmospheric transfer chamber 21 opposite to a sidewall facing the processing part 2. Each load port 22 has a placement table 25 and a transfer port 26. A front opening unified pod (FOUP) 20 that is a substrate storage container accommodating a plurality of wafers is placed on the placement table 25. The FOUP 20 on the placement table 25 is connected in a sealed state to the atmospheric transfer chamber 21 through the transfer port 26. The aligner module 23 is connected to one short sidewall of the atmospheric transfer chamber 21. The alignment of the wafer is performed in the aligner module 23.

The two load-lock modules LLM1 and LLM2 allow wafers to be transferred between the atmospheric transfer chamber 21 maintained at an atmospheric pressure and the transfer chamber 12 maintained at a vacuum atmosphere, and a pressure in each of the load-lock modules LLM1 and LLM2 is variable between an atmospheric pressure and a vacuum level similar to that in the transfer chamber 12. Each of the two load-lock modules LLM1 and LLM2 has two transfer ports. One of the two transfer ports is connected to the long sidewall of the atmospheric transfer chamber 21 facing the processing part 2 through a gate valve G2. The other transfer port is connected to the transfer chamber 12 of the processing part 2 through a gate valve G1.

The load-lock module LLM1 is used when the wafer is transferred from the loading/unloading part 3 to the processing part 2. The load-lock module LLM2 is used when the wafer is transferred from the processing part 2 to the loading/unloading part 3. Further, processing such as degassing or the like may be performed in the load-lock modules LLM1 and LLM2.

The second transfer device 24 in the atmospheric transfer chamber 21 has a multi-joint structure, and transfers wafers to the FOUP 20 on the load port 22, the aligner module 23, and the load-lock modules LLM1 and LLM2. Specifically, the second transfer device 24 takes out an unprocessed wafer from the FOUP 20 of the load port 22, and transfers the wafer W to the aligner module 23 and then from the aligner module 23 to the load-lock module LLM1. Further, the second transfer device 24 receives a processed wafer transferred from the processing part 2 to the load-lock module LLM2 and transfers the wafer to the FOUP 20 of the load port 22. Although FIG. 1 shows an example in which the second transfer device 24 has one pick for receiving a wafer, the second transfer device 24 may have two picks.

The first transfer device 11 and the second transfer device 24 constitute the transfer part of the semiconductor manufacturing apparatus 1. In the processing part 2, the process modules PM1, PM3, PM5, PM7 and PM9 are arranged on one side of the transfer chamber 12 in that order from the load-lock module LLM1 side. The process modules PM2, PM4, PM6, PM8, and PM10 are arranged on another side of the transfer chamber 12 in that order from the load-lock module LLM2 side. In the first transfer device 11, the transfer modules TM1, TM2, TM3, TM4, and TM5 are arranged in that order from the load-lock modules LLM1 and LLM2 side.

The transfer mechanism 31*a* of the transfer module TM1 is accessible to the load-lock modules LLM1 and LLM2, the process modules PM1 and PM2, and the delivery part 41. The transfer mechanism 31*b* of the transfer module TM2 is accessible to the process modules PM1, PM2, PM3, and PM4, and the delivery parts 41 and 42.

The transfer mechanism 31*c* of the transfer module TM3 is accessible to the process modules PM3, PM4, PM5, and PM6, and the delivery parts 42 and 43. The transfer mechanism 31*d* of the transfer module TM4 is accessible to the process modules PM5, PM6, PM7, and PM8, and the delivery parts 43 and 44. The transfer mechanism 31*e* of the transfer module TM5 is accessible to the process modules PM7, PM8, PM9, and PM10, and the delivery part 44.

Figure 2:
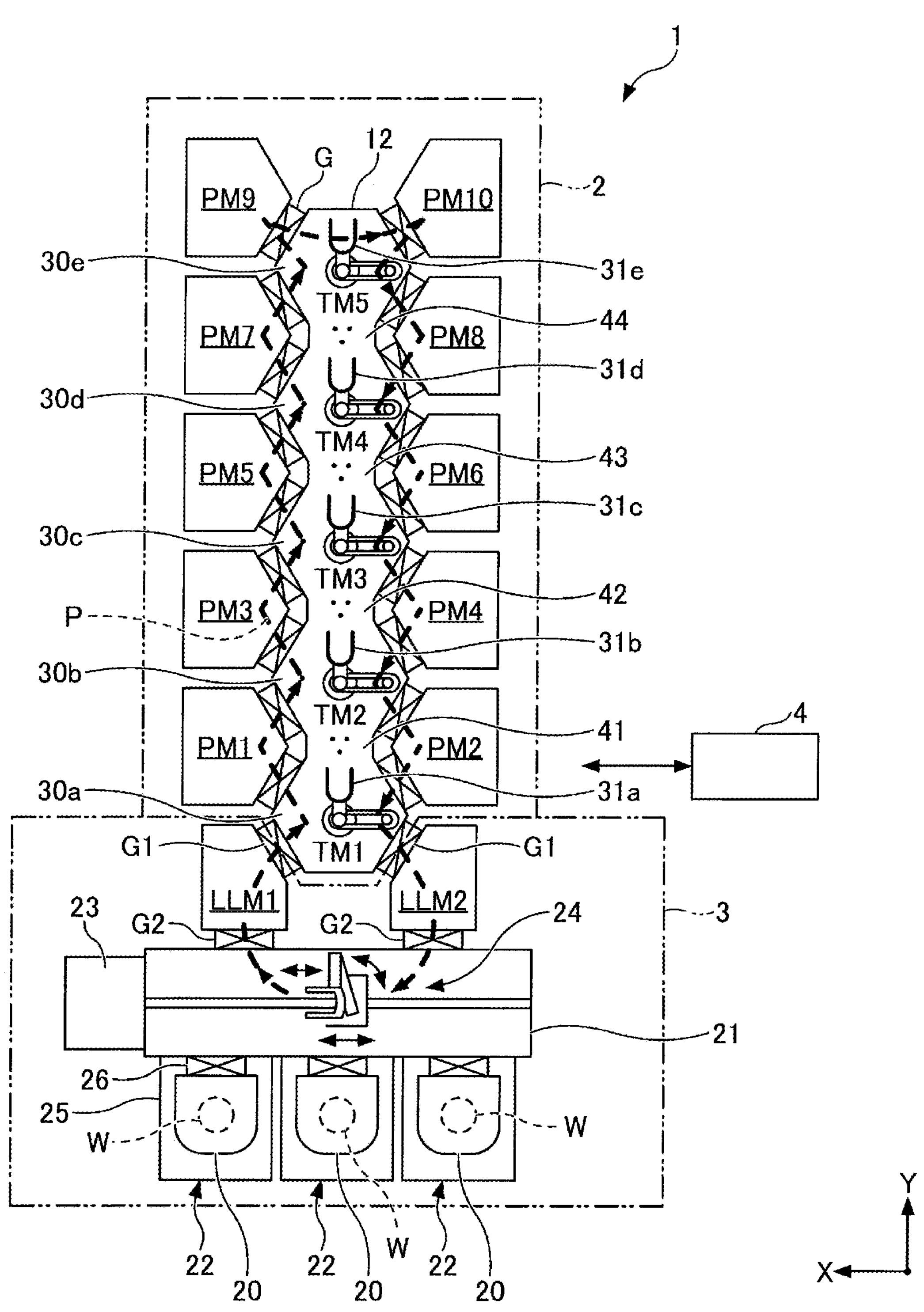
FIG. 2 is a schematic cross-sectional view showing an example of a wafer transfer path of the semiconductor manufacturing apparatus according to the embodiment.

The second transfer device 24 and the transfer modules TM1 to TM4 of the first transfer device 11 are configured as shown in FIG. 1. Therefore, as shown in FIG. 2, the wafer taken out from the FOUP 20 is serially transferred in one direction along a substantially U-shaped path P in the processing part 2, processed in the respective process modules PM1 to PM10, and returned to the FOUP 20. In other words, the wafer is serially transferred in the order of the process modules PM1, PM3, PM5, PM7, PM9, PM10, PM8, PM6, PM4, and PM2, and subjected to desired processing.

The semiconductor manufacturing apparatus 1 can be used for forming an oxide semiconductor film used in a flat panel display, for example. The oxide semiconductor film is formed by a plurality of desired processes such as pre-cleaning, film formation, oxidation, heat treatment, cooling, and the like. The desired processes are performed in the process modules PM1 to PM10. At least one of the process modules PM1 to PM10 may be a standby module in which a wafer stands by.

The controller 4 controls individual components of the semiconductor manufacturing apparatus 1. The controller 4 controls, e.g., the transfer modules TM1 to TM5 (the transfer mechanisms 31*a* to 31*e*), the second transfer device 24, the process modules PM1 to PM10, the load-lock modules LLM1 and LLM2, the transfer chamber 12, and the gate valves G, G1, and G2. The controller 4 is a computer, for example.

Figure 3:
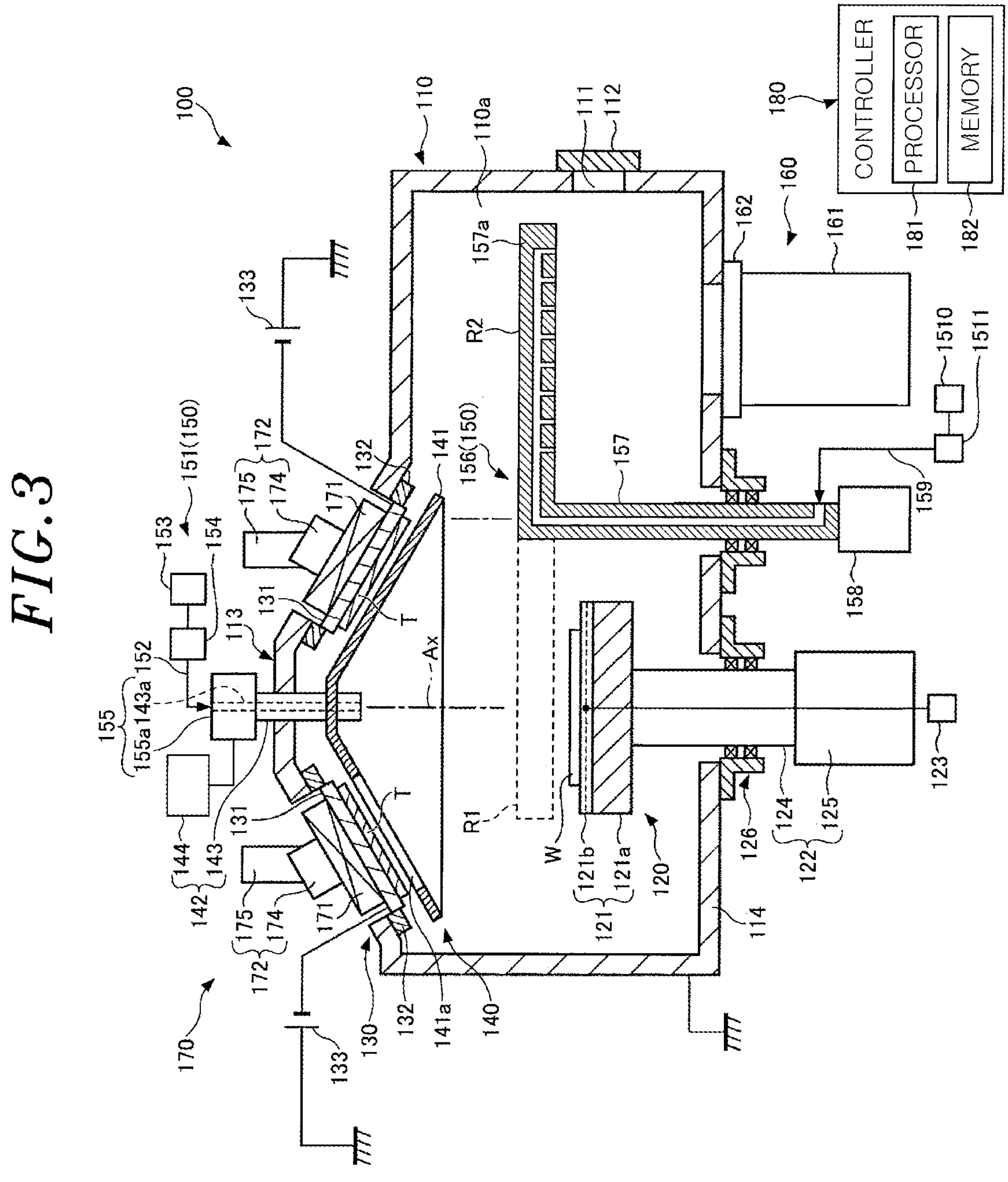
FIG. 3 is a schematic cross-sectional view of an example of a film forming apparatus according to an embodiment.

FIG. 3 is a schematic cross-sectional view of a film forming apparatus 100 that is an example of a film forming apparatus of the semiconductor manufacturing apparatus according to the embodiment. As shown in FIG. 3, the film forming apparatus 100 of the present embodiment is a physical vapor deposition (PVD) apparatus for forming a film by depositing a material on a semiconductor wafer (hereinafter, simply referred to as "substrate W") that is an example of a substrate.

The film forming apparatus 100 includes a processing chamber 110 having an inner space 110*a* for performing film formation on the substrate W. The film forming apparatus 100 further includes, as a configuration for performing film formation on the substrate W in the processing chamber 110, a stage mechanism 120, a target holder 130, a target cover 140, a gas supply device 150, a gas outlet 160, and a magnet mechanism 170. In addition, the film forming apparatus 100 further includes the controller 180 for controlling the operations of the individual components.

The film forming apparatus 100 is installed as one of the process modules PM1 to PM10 of the semiconductor manufacturing apparatus 1, for example. The semiconductor manufacturing apparatus 1 performs cleaning, etching, or the like, in addition to the film formation, on the substrate W.

The processing chamber 110 of the film forming apparatus 100 is made of aluminum, for example. The processing chamber 110 is connected to the ground potential. In other words, the processing chamber 110 is grounded. The processing chamber 110 has a loading/unloading port 111 through which the inner space 110*a* and the outside of the processing chamber 110 communicate, and a gate valve 112 for opening and closing the loading/unloading port 111. In the film forming apparatus 100, when the gate valve 112 is opened, the substrate W is loaded/unloaded through the loading/unloading port 111 by a transfer device (not shown).

The processing chamber 110 has a processing central axis Ax extending along the vertical direction and located at the center of film formation performed on the substrate W in the inner space 110*a*. The processing central axis Ax is set to pass through the center of the substrate W placed on the stage mechanism 120. Further, the processing chamber 110 has a pyramid-shaped portion 113 having a substantially pyramid shape (e.g., a substantially quadrangular pyramid shape, a conical shape, or the like) at a ceiling portion located above the stage mechanism 120. The processing central axis Ax is configured to pass through the center (apex) of the pyramid-shaped portion 113.

The stage mechanism 120 includes a placement table 121 disposed in the processing chamber 110 and a supporting and driving part 122 for supporting and driving the placement table 121. The placement table 121 has a substantially disc-shaped base portion 121*a* and an electrostatic chuck 121*b* fixed on the base portion 121*a*.

The base portion 121*a* is made of aluminum, for example. The base portion 121*a* is fixed to the upper end of the supporting and driving part 122. By moving the base portion 121*a* using the supporting and driving part 122, the electrostatic chuck 121*b* is located at a predetermined height position in the inner space 110*a*. The stage mechanism 120 may include a temperature control mechanism (not shown) for adjusting a temperature of the base portion 121*a* to control a temperature of the substrate W placed on the placement table 121.

The electrostatic chuck 121*b* includes a dielectric film and an electrode embedded in the dielectric film (both not shown). A DC power supply 123 is connected to the electrode of the electrostatic chuck 121*b*. The electrostatic chuck 121*b* electrostatically attracts the substrate W placed on the upper surface of the electrostatic chuck 121*b* by generating an electrostatic force in the dielectric film by a DC voltage supplied to the electrode from the DC power supply 123. The center of the upper surface (the placement surface of the substrate W) of the electrostatic chuck 121*b* coincides with the processing central axis Ax.

The supporting and driving part 122 has a columnar support shaft 124 holding the base portion 121*a* and a driving device 125 for driving the support shaft 124. The support shaft 124 extends along the vertical direction and extends from the inner space 110*a* of the processing chamber 110 to the outside of the processing chamber 110 through a bottom portion 114. The center of the support shaft 124 overlaps the processing central axis Ax.

The driving device 125 is disposed outside the processing chamber 110. The driving device 125 holds the lower end of the support shaft 124. The driving device 125 rotates the support shaft 124 about the processing central axis Ax under the control of the controller 180. Further, the driving device 125 raises and lowers (moves up and down) the support shaft 124. The placement table 121 rotates and is raised and lowered in the processing chamber 110 by the driving of the driving device 125.

The stage mechanism 120 also includes a sealing structure 126 for sealing the gap between the bottom portion 114 of the processing chamber 110 and the support shaft 124 while allowing the operation of the support shaft 124. For example, a magnetic fluid seal can be applied as the sealing structure 126.

The target holder 130 of the film forming apparatus 100 holds a plurality of targets T that are cathode targets at positions spaced upward apart from the placement table 121. The film forming apparatus 100 of the present embodiment includes four target holders 130. Each of the target holders 130 includes a metal holder 131 holding each target T, and an insulating member 132 for fixing an outer periphery of each holder 131 to support the holder 131.

The target T held by each holder 131 is made of a film forming material. Each target T is a rectangular flat plate. The film forming apparatus 100 may include multiple targets T made of different types of materials. For example, a multilayer film can be formed in the processing chamber 110 by performing sputtering while switching multiple targets T made of different materials. In other words, the film forming apparatus 100 may perform simultaneous sputtering (co-sputtering) for simultaneously performing film formation on multiple targets.

The film forming apparatus 100 of the present embodiment forms an alloy film containing a plurality of elements on the substrate W, as an example of the film formation. In the present disclosure, an example of forming an alloy film containing indium, gallium, zinc, and oxygen will be described as an example of forming an alloy film containing a plurality of elements on the substrate W. The alloy film containing indium, gallium, zinc, and oxygen may be referred to as "IGZO film." In the case of forming an alloy film containing indium, gallium, zinc, and oxygen, at least one of the targets T is made of an alloy film containing indium, gallium, zinc, and oxygen.

Each of the holders 131 is formed in a rectangular shape larger than that of the target T in plan view. Each of the holders 131 is fixed to the inclined surface of the pyramid-shaped portion 113 via the insulating member 132. Since the holders 131 are fixed to the inclined surface of the pyramid-shaped portion 113, the holders 131 hold the surfaces (sputtering surfaces exposed to the inner space 110*a*) of the targets T in an inclined state with respect to the processing central axis Ax.

Further, the target holders 130 electrically connect multiple power supplies 133 to the targets T held by the holders 131. Each of the power supplies 133 applies a negative DC voltage to the target T connected thereto. The power supplies 133 may be a single power supply that selectively applies a voltage to the targets T.

Figure 4:
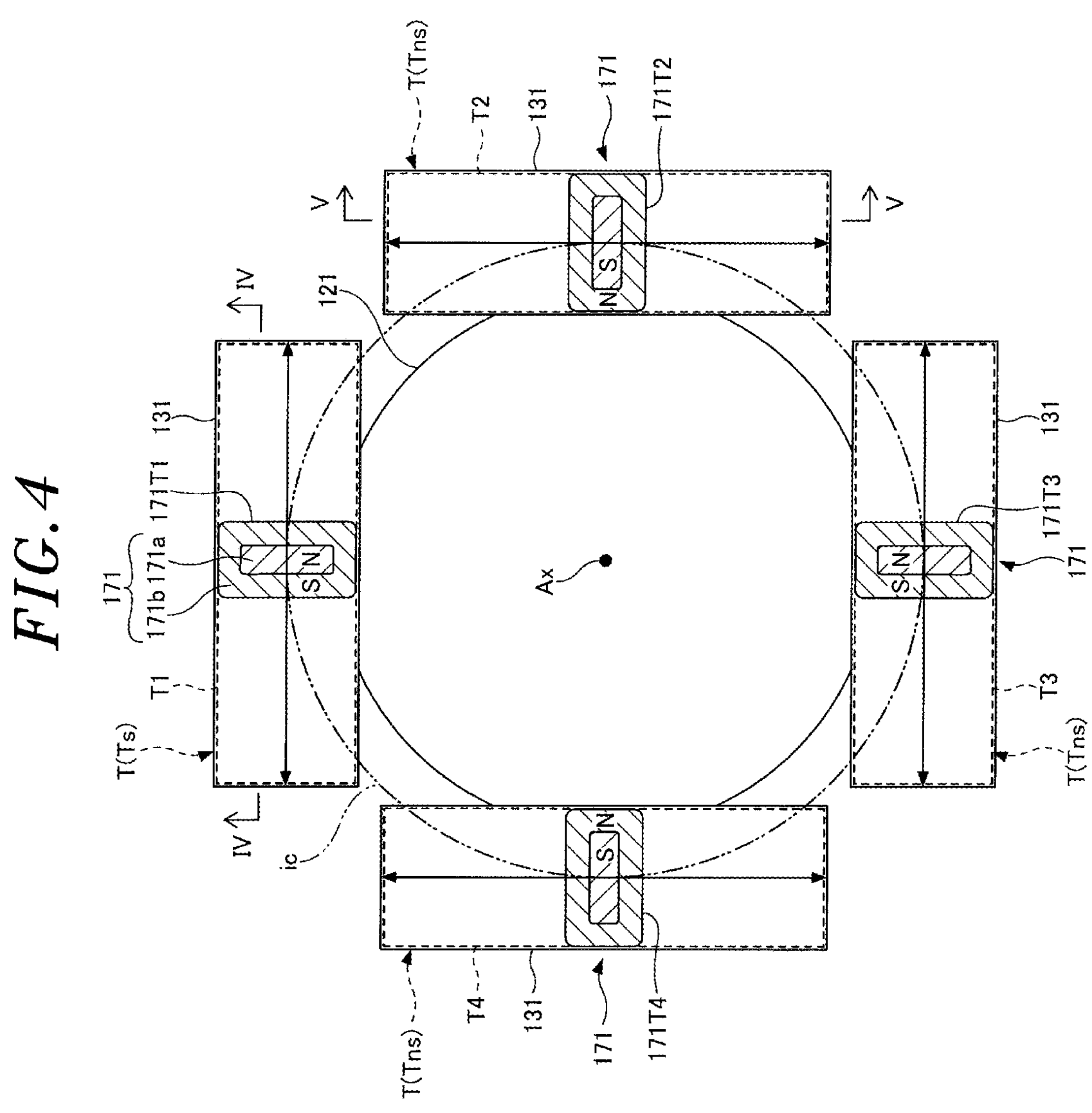
FIG. 4 is a schematic plan view showing arrangement of four holders and four magnets in an example of the film forming apparatus according to the embodiment.

FIG. 4 is a schematic plan view showing the arrangement of four holders 131 and four magnets 171 of the film forming apparatus 100. As shown in FIG. 4, in the target holder 130, multiple holders 131 (and multiple targets T) are arranged at regular intervals along a virtual circle ic centered on the processing central axis Ax. In other words, the four holders 131 (and the four targets T) are arranged on the virtual circle ic at intervals of 90 degrees. Further, the four holders 131 (and the four targets T) are arranged such that the long sides of the holders 131 extend in parallel with the tangent line of the virtual circle ic. The four targets T are held at the same positions as those of the holders 131 to face obliquely downward (see also FIG. 3).

In the following description, the four targets T may be distinguished and referred to as "first target T1, second target T2, third target T3, and fourth target T4" in a clockwise direction from the upper position of the virtual circle ic in FIG. 4. For example, when the first target T1 is sputtered during film formation by the film forming apparatus 100, the first target T1 is set to a selected target Ts, and the second target T2, the third target T3, and the fourth target T4 are set to non-selected targets Tns. The number of targets T and the number of holders 131 in the film forming apparatus 100 are not particularly limited, and may be two, three, or five or more. For example, when the film forming apparatus 100 includes three targets T and three holders 131, they may be arranged at intervals of 120 degrees on the virtual circle ic.

Referring back to FIG. 3, the target cover 140 of the film forming apparatus 100 includes a shutter main body 141 disposed in the processing chamber 110 and a shutter driving device 142 for supporting and driving the shutter main body 141.

The shutter main body 141 is disposed between the multiple targets T and the placement table 121. The shutter main body 141 is formed in a pyramid shape substantially parallel to the inclined surface of the pyramid-shaped portion 113 of the processing chamber 110. The shutter main body 141 can face the sputtering surfaces of the targets T. Further, the shutter main body 141 has one opening 141*a* that is slightly greater than the target T.

The opening 141*a* is disposed face one target T (selected target Ts) among the plurality of targets T by the shutter driving device 142. When the opening 141*a* is disposed to face the selected target Ts, the shutter main body 141 exposes only the selected target Ts to the substrate W on the placement table 121. The shutter main body 141 does not expose other targets T (non-selected targets Tns).

The shutter driving device 142 includes a columnar rotation shaft 143 and a rotating part 144 for rotating the rotation shaft 143. The axis of the rotation shaft 143 coincides with the processing central axis Ax of the processing chamber 110. The rotation shaft 143 extends along the vertical direction, and fixes the center (apex) of the shutter main body 141 at the lower end thereof. The rotation shaft 143 protrudes to the outside of the processing chamber 110 while passing through the center of the pyramid-shaped portion 113.

The rotating part 144 is disposed outside the processing chamber 110, and rotates the rotation shaft 143 relative to an upper end (connector 155*a*) holding the rotation shaft 143 via a rotation transmission part (not shown). Accordingly, the rotation shaft 143 and the shutter main body 141 rotate about the processing central axis Ax. Hence, the target cover 40 can adjust the circumferential position of the opening 141*a* under the control of the controller 180 so that the opening 141*a* can face the selected target Ts to be sputtered.

The film forming apparatus 100 uses the target cover 140 to perform sputtering while switching targets. However, the film forming apparatus 100 may not include the target cover 140, and perform simultaneous sputtering.

The gas supply device 150 of the film forming apparatus 100 includes an excitation gas part 151 disposed at the pyramid-shaped portion 113 to supply an excitation gas, and an oxidizing gas part 156 disposed at the bottom portion 114 of the processing chamber 110 to supply a gas for oxidation (hereinafter, referred to as "oxidizing gas)." The film forming apparatus 100 may not include the oxidizing gas part 156 when it is not required to oxidize a metal deposited on the substrate W.

The excitation gas part 151 includes a line 152 for circulating a gas outside the processing chamber 110. Further, the excitation gas part 151 includes a gas source 153, a flow rate controller 154, and a gas inlet 155 in that order from the upstream side to the downstream side of the line 152.

The gas source 153 stores an excitation gas (e.g., argon gas). The gas source 153 supplies a gas to the line 152. The flow rate controller 154 may be, e.g., a mass flow controller or the like, and adjusts a flow rate of a gas supplied into the processing chamber 110. The gas inlet 155 introduces a gas from the outside of the processing chamber 110 into the processing chamber 110. The gas inlet 155 includes the connector 155*a* connected to the line 152 at the outside of the processing chamber 110, and a gas channel 143*a* formed in the rotation shaft 143 of the target cover 140.

The oxidizing gas part 156 includes a head member 157 for injecting an oxidizing gas (e.g., oxygen), and a rotating device 158 for rotating the head member 157. The oxidizing gas part 156 injects an oxidizing gas from the head member 157 toward the placement table 121 at the time of oxidizing a film deposited on the substrate W. The head member 157 is connected to a line 159 for an oxidizing gas at the outside of the processing chamber 110. The line 159 is provided with an oxidizing gas source 1510 and a flow rate controller 1511 for adjusting a flow rate of an oxidizing gas. The rotating device 158 displaces an oxidizing gas injector 157*a* of the head member 157 between a facing region R1 facing the placement surface of the placement table 121 and a retracting region R2 distant from the placement table 121.

The gas outlet 160 of the film forming apparatus 100 includes a decompression pump 161, and an adapter 162 for fixing the decompression pump 161 to the bottom portion 114 of the processing chamber 110. The gas outlet 160 decreases the pressure in the inner space 110*a* of the processing chamber 110 under the control of the controller 180.

The magnet mechanism 170 of the film forming apparatus 100 applies magnetic field H to the targets T. The magnet mechanism 170 induces plasma to the targets T by applying the magnetic field H to the targets T. The magnet mechanism 170 includes, for each of the holders 131, a magnet 171 (cathode magnet) and a driving device 172 for supporting and driving the magnet 171. The film forming apparatus 100 of the present embodiment includes four magnets 171 and four driving devices 172 for respectively holding the four magnets 171 to correspond to the four holders 131.

As shown in FIG. 4, the four magnets 171 are arranged to overlap the targets T on the virtual circle ic. The magnets 171 may be distinguished and referred to "first magnet 171T1, second magnet 171T2, third magnet 171T3, and fourth magnet 171T4" in a clockwise direction to correspond to the four targets T (first target T1 to fourth target T4).

The magnets 171 have the same shape, and generate substantially the same level of magnetic forces. Specifically, the magnets 171 have a substantially rectangular shape in plan view. In the holding state of the driving device 172, the long sides of the magnets 171 extend in parallel to the short sides of the rectangular targets T, whereas the short sides of the magnets 171 extend in parallel to the long sides of the rectangular targets T.

The magnets 171 may be permanent magnets. The material of the magnets 171 is not particularly limited as long as it has an appropriate magnetic force, and may be iron, cobalt, nickel, samarium, and neodymium, for example.

Each of the magnets 171 is magnetized to have a first magnetic pole 171*a* at the inner side (at the center) and a second magnetic pole 171*b* opposite to the first magnetic pole 171*a* at the outer side of the first magnetic pole 171*a*. The second magnetic pole 171*b* surrounds the entire circumference of the first magnetic pole 171*a*. In other words, in the magnet 171, the second magnetic pole 171*b*, the first magnetic pole 171*a*, and the second magnetic pole 171*b* are arranged in that order when viewed from the cross section taken along the lateral direction or the longitudinal direction.

The magnets 171 adjacent to each other along the circumferential direction of the virtual circle are set to have different polarities between the first magnetic poles 171*a* and the second magnetic poles 171*b*. In other words, in FIG. 4, when the first magnetic pole 171*a* of the first magnet 171T1 is an N pole and the second magnetic pole 171*b* thereof is an S pole, the first magnetic poles 171*a* of the second magnet 171T2 and the fourth magnet 171T4 are S poles, and the second magnetic poles 171*b* thereof are N poles. Further, the first magnetic pole 171*a* of the third magnet 171T3 is an N pole and the second magnetic pole 171*b* thereof is an S pole.

Each driving device 172 holding each magnet 171 reciprocates the held magnet 171 along the longitudinal direction of the targets T. In other words, the magnets 171 are movable. Further, each driving device 172 holding each magnet 171 move the held magnets 171 to be close to or distant from the targets T. Specifically, each driving device 172 includes a reciprocating mechanism 174 for holding and reciprocating the magnet 171, and an approaching/separating mechanism 175 for holding and moving the reciprocating mechanism 174 to be close to or distant from the target T.

<Distribution of Emission Angles of Metal Elements from Target T>

When an alloy target containing multiple types of metal elements is used as the target T, the emission angles of the metal elements emitted from the sputtered target T vary depending on the types of the metal elements.

Figure 5:
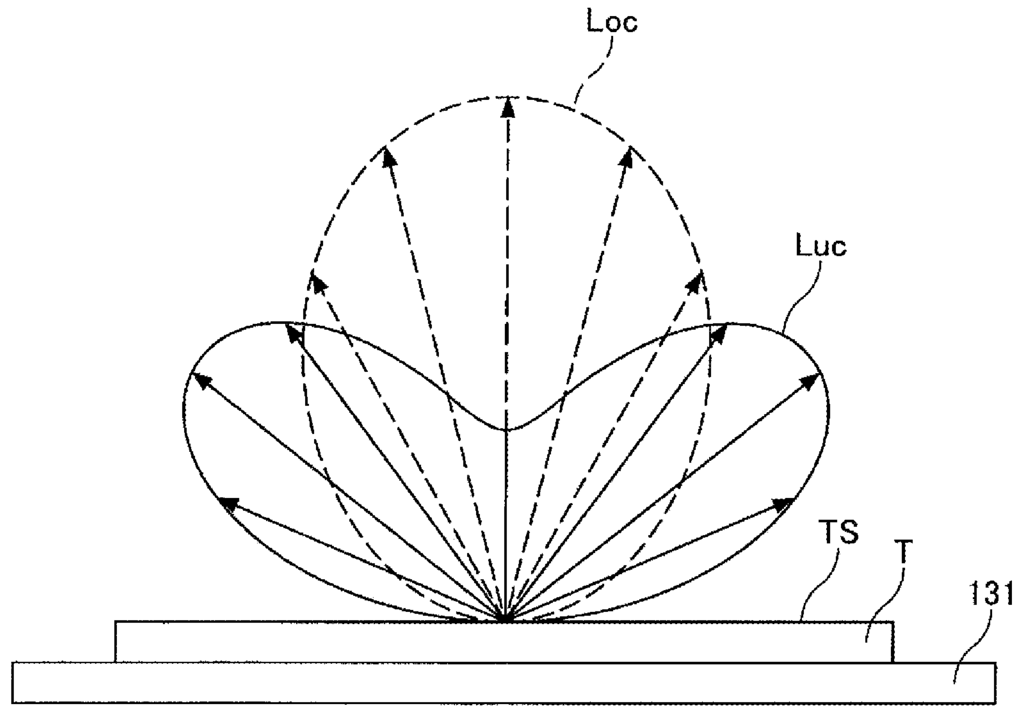
FIG. 5 explains distribution of angles at which sputtered elements are emitted from a target surface in the film forming apparatus.

FIG. 5 explains the distribution of emission angles of sputtered elements from the target surface TS in the film forming apparatus 100. The target T is held by the holder 131. The film forming apparatus 100 includes the magnet 171 on the side of the holder 131 opposite to the target T. The elements are sputtered and emitted from the target T near the magnet 171.

The angles between the emission directions of the sputtered elements and the normal direction of the target surface TS of the target T, that is, the emission angles of the elements, are set to angles $\theta$ (unit: radian), and the distribution of the angles $\theta$ is set to angle distribution $A(\theta)$ (unit: dimensionless). The angle distribution $A(\theta)$ is defined as in the following Eq. (1) while setting a constant for normalization to a constant $\alpha$ (unit: dimensionless) and a variable that defines the distribution to a variable $\beta$ (unit: dimensionless).

$$A(\theta) = \alpha\cos\theta\left(1 + \beta\cos^2\theta\right) \quad \text{Eq. (1)}$$

When the variable $\beta$ is 0, the angle distribution $A(\theta)$ becomes cosine distribution. When the variable $\beta$ is negative, the angle distribution $A(\theta)$ becomes undercosine distribution. When the variable $\beta$ is positive, the angle distribution $A(\theta)$ becomes overcosine distribution.

In FIG. 5, a line Luc indicates the angle distribution $A(\theta)$ when the variable $\beta$ is −0.8. In other words, the line Luc indicates the angle distribution $A(\theta)$ that is the undercosine distribution. In FIG. 5, a line Loc indicates the angle distribution $A(\theta)$ when the variable $\beta$ is 0.8. In other words, the line Loc indicates the angle distribution $A(\theta)$ that is the overcosine distribution.

When the angle distribution $A(\theta)$ is the undercosine distribution (line Luc), a small amount of elements are emitted in the direction (normal direction) perpendicular to the target surface TS. When the angle distribution $A(\theta)$ is the undercosine distribution (line Luc), a large amount of elements are emitted in the direction inclined toward the target surface TS from the direction (normal direction) perpendicular to the target surface TS.

On the other hand, when the angle distribution $A(\theta)$ is the overcosine distribution (line Loc), a large amount of elements are emitted in the direction (normal direction) perpendicular to the target surface TS. When the angle distribution $A(\theta)$ is the overcosine distribution (line Loc), a small amount of elements are emitted in the direction inclined toward the target surface TS from the direction (normal direction) perpendicular to the target surface TS.

Figure 6A:
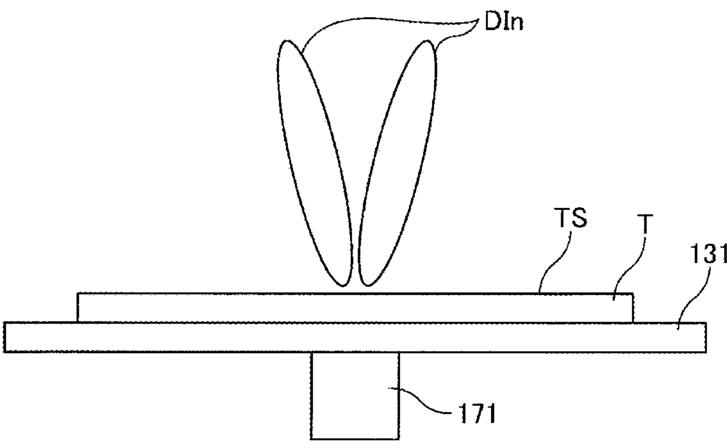
FIGS. 6A to 6C explain distribution of angles at which elements sputtered from an alloy target are emitted from the target surface in the film forming apparatus.
Figure 6B:
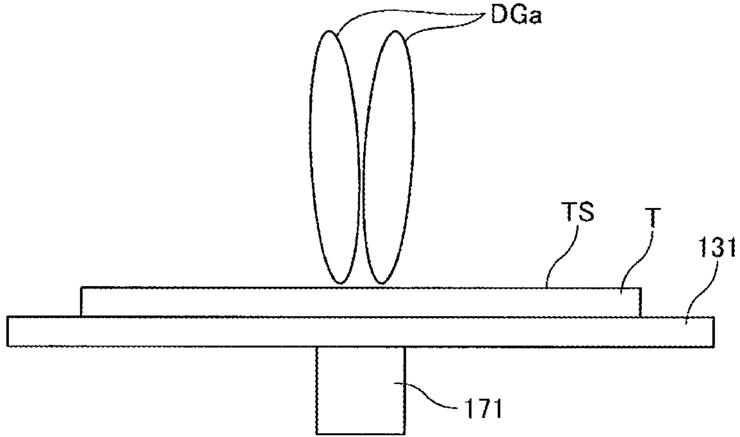
Figure 6C:
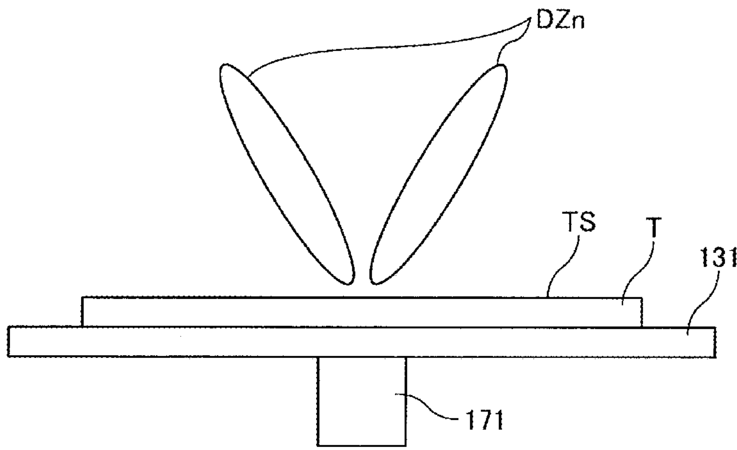

In the case of forming an alloy film (IGZO film) containing indium, gallium, zinc, and oxygen on the substrate W, the target T made of an alloy film (IGZO film) containing indium, gallium, zinc, and oxygen is sputtered. FIGS. 6A to 6C conceptually show the angle distribution of indium, gallium, and zinc contained in the target T and emitted from the target T during sputtering.

FIG. 6A shows angle distribution DIn of indium emitted from the target T by sputtering. FIG. 6B shows angle distribution DGa of gallium emitted from the target T by sputtering. FIG. 6C shows angle distribution DZn of zinc emitted from the target T by sputtering.

The angle distribution DIn of indium and the angle distribution DZn of zinc have a high frequency in the direction inclined with respect to the normal direction of the target surface TS of the target T. In other words, each of indium and zinc is emitted in a direction inclined from the normal direction of the target surface TS of the target T. In particular, zinc is inclined at a large angle from the normal direction of the target surface TS of the target T.

On the other hand, the angle distribution DGa of gallium has a high frequency in the normal direction of the target surface TS of the target T. In other words, gallium is emitted in the normal direction of the target surface TS of the target T.

As described above, the angle distribution of elements emitted from the target T varies depending on types of elements contained in the alloy target. If the angle distribution of elements emitted from the target T varies, the film deposited on the substrate W by sputtering the target becomes non-uniform in the plane direction. In other words, the in-plane distribution varies depending on types of elements contained in the alloy target, and the in-plane distribution of the film formed on the substrate W becomes non-uniform depending on the elements. In other words, the uniformity of the formed film in the plane direction deteriorates. If the in-plane distribution of the film formed on the substrate W becomes non-uniform, the yield of the product deteriorates.

The film forming apparatus 100 of the present embodiment improves the in-plane distribution of the elements that are contained in the alloy target and are likely to have non-uniform in-plane distribution. An element that is likely to have non-uniform in-plane distribution is, e.g., an element emitted in a direction inclined from the normal direction of the target surface TS of the target T during sputtering. In the case of forming an IGZO film, zinc is an element that is likely to have non-uniform in-plane distribution.

<First Distribution Improvement Method>

Figure 7:
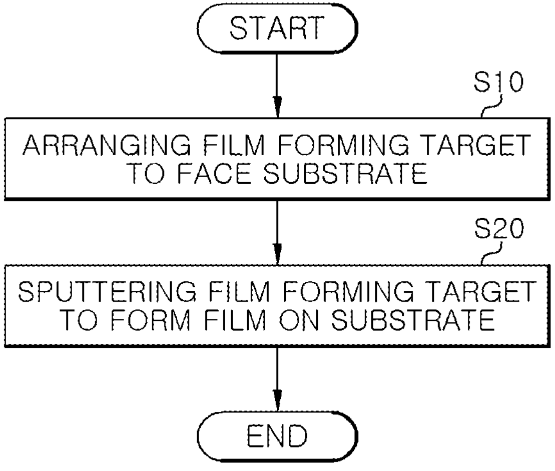
FIG. 7 is a flowchart explaining a first distribution improvement method in an example of the film forming apparatus according to the embodiment.

Hereinafter, a film forming method using the film forming apparatus 100 of the present embodiment will be described. FIG. 7 is a flowchart explaining a first distribution improvement method for the film forming apparatus 100 that is an example of the film forming apparatus of the present embodiment.

The film forming method using the film forming apparatus 100 includes arranging a film forming target to face a substrate (step S10, step (a)), and sputtering the film forming target to form a film on the substrate (step S20, step (b)). In the film forming method using the film forming apparatus 100, in step S20, a larger amount of an element that is likely to have non-uniform distribution is supplied to a portion where the distribution amount of the corresponding element is small.

Figure 8:
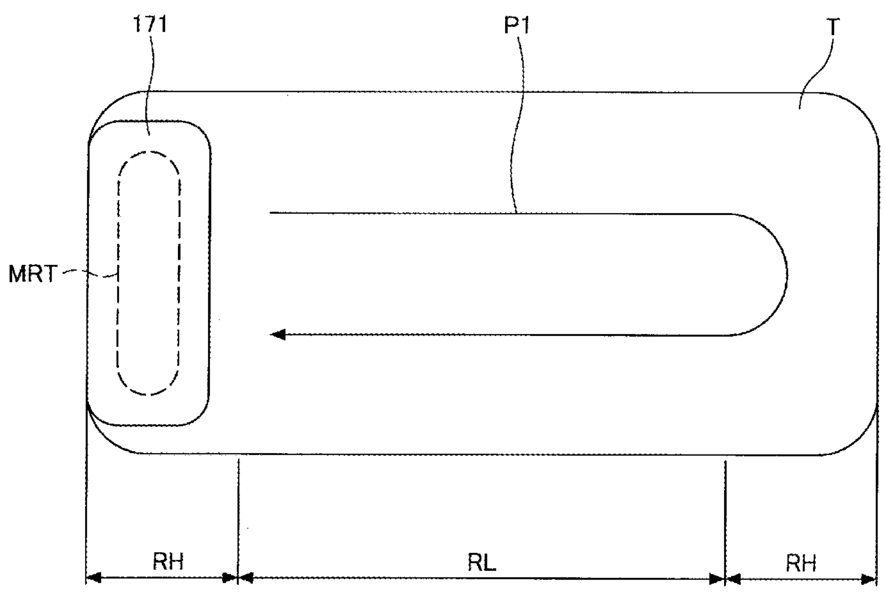
FIGS. 8 and 9 explain the first distribution improvement method in an example of the film forming apparatus according to the embodiment.
Figure 9:
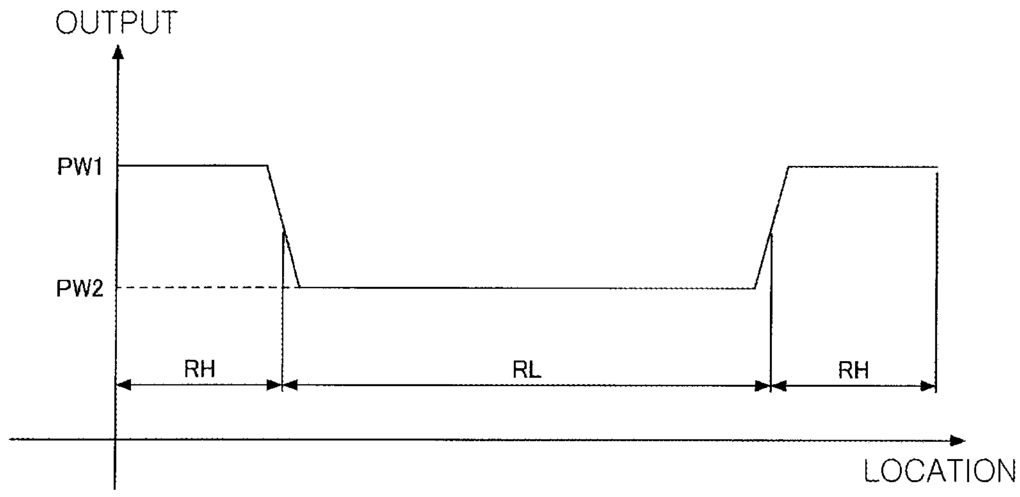

Hereinafter, the first distribution improvement method for the film forming apparatus 100 of the present embodiment will be described. FIGS. 8 and 9 explain the first distribution improvement method for the film forming apparatus 100 that is an example of the film forming apparatus of the present embodiment. A case of depositing an IGZO film in the film forming apparatus 100 of the present embodiment will be described. In the case of depositing an IGZO film, the power supply 133 is controlled such that a large amount of zinc is deposited on the outer periphery of the substrate W because the amount of zinc is insufficient at the outer periphery of the substrate W.

FIG. 8 explains the operation of the magnet 171 of the film forming apparatus 100. The magnet 171 of the film forming apparatus 100 reciprocates in the longitudinal direction of the target T on the side of the target T opposite to the substrate W. The magnet 171 reciprocates while repeating movement as indicated by an arrow P1 in FIG. 8.

In the first distribution improvement method, the power supplied from the power supply 133 to the holder 131 is higher at the edge of the target T than at the center of the target T. Specifically, the power supplied by the power supply 133 to the holder 131 is greater in a high power region RH on the edge side of the target T than in a low power region RL on the center side of the target T.

FIG. 9 explains the power supplied by the power supply 133 of the film forming apparatus 100. The power supply 133 supplies an output of a power PW2 to the holder 131 when the magnet 171 is located in the low power region RL on the center side of the target. The power supply 133 supplies an output of a power PW1 higher than the power PW2 to the holder 131 when the magnet 171 is located in the high power region RH on the edge side of the target.

Figure 10:
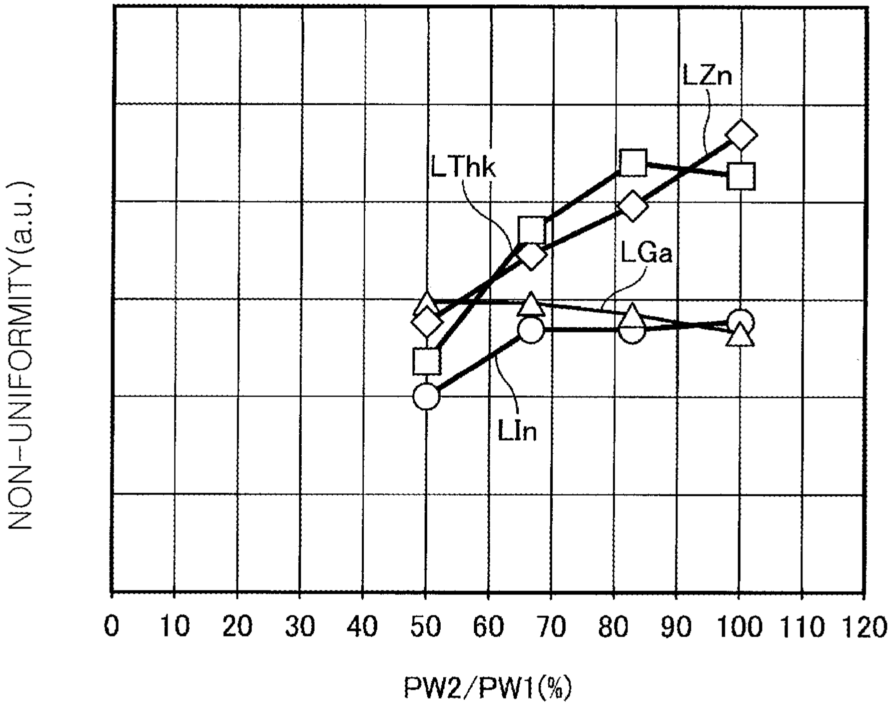
FIG. 10 explains an evaluation result when the first distribution improvement method in an example of the film forming apparatus according to the embodiment is performed.

Hereinafter, the evaluation results obtained when the film forming apparatus 100 performs the first distribution improvement method will be described. FIG. 10 explains the evaluation results obtained when the film forming apparatus 100 that is an example of the film forming apparatus of the present embodiment performs the first distribution improvement method.

The vertical axis of FIG. 10 represents the non-uniformity of (unit: arbitrary unit) of the film thickness of the film deposited on the substrate W by sputtering or the amount of elements in the plane of the film deposited on the substrate W. The horizontal axis of FIG. 10 represents the ratio (unit: %) of the power PW2 in the low power region RL on the center side of the target T to the power PW1 in the high power region RH on the edge side of the target T.

A line LGa indicates the non-uniformity of the amount of gallium in the plane of the deposited film. Gallium is emitted in the normal direction from the target surface TS of the target T during sputtering. Therefore, the non-uniformity of the amount of gallium has a substantially constant value even if the ratio of the power PW2 to the power PW1 is changed.

A line LIn indicates the non-uniformity of the amount of indium in the plane of the deposited film. The line LZn indicates the non-uniformity of the amount of zinc in the plane of the deposited film. Indium and zinc are emitted from the target surface TS of the target T in a direction inclined with respect to the normal direction during sputtering. Therefore, the non-uniformity changes if the ratio of the power PW2 to the power PW1 changes. Particularly, in the case of zinc emitted at a large inclination angle with respect to the normal direction, the non-uniformity changes considerably if the ratio of the power PW2 to the power PW1 changes.

On the other hand, the results of FIG. 10 show that when the power PW1 increases compared to the power PW2, the values indicating the non-uniformity of gallium, indium, and zinc are improved. Particularly, when the ratio of the power PW2 to the power PW1 is 0.5, the values indicating the non-uniformity of gallium, indium, and zinc are small enough to be allowable in each element. Hence, it is possible to form uniform films of gallium, indium, and zinc by increasing the power PW1 compared to the power PW2.

A line LThk indicates the non-uniformity of the film thickness of the deposited film in the plane of the deposited film. If the ratio of the power PW2 and the power PW1 changes, the non-uniformity of the film thickness of the deposited film changes substantially similarly to the case of zinc. On the other hand, the non-uniformity of the film thickness of the deposited film is improved if the power PW1 increases compared to the power PW2. Particularly, the value indicating the non-uniformity can be reduced to a level that is acceptable by setting the ratio of the power PW2 to the power PW1 to 0.5. Therefore, the thickness of the formed alloy film can become uniform by increasing the power PW1 compared to the power PW2.

In the above description, the power is supplied to the target T. However, the power may be supplied to a distribution improvement target Tc2 to be described later.

The target T is an example of a first target. The material deposited on the target T is an example of a first material. The holder 131 holding the target T is an example of a first holder.

<Second Distribution Improvement Method>

Figure 11:
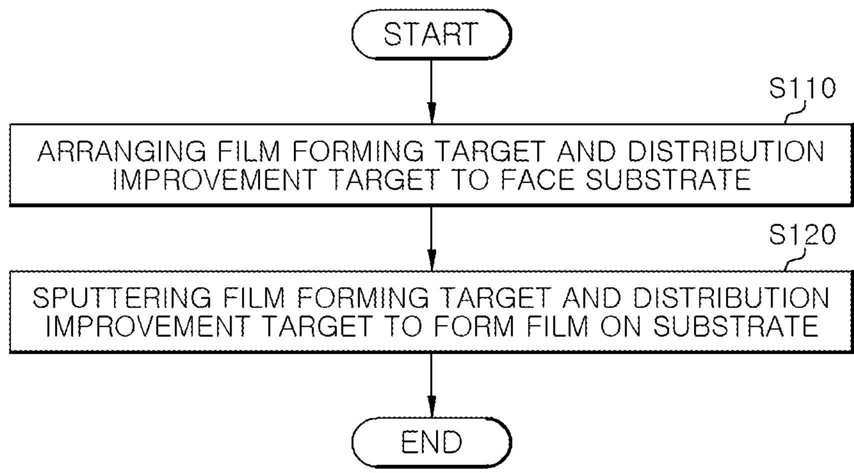
FIG. 11 is a flowchart explaining a second distribution improvement method in an example of the film forming apparatus according to the embodiment.

FIG. 11 is a flowchart explaining the second distribution improvement method for the film forming apparatus 100 that is an example of the film forming apparatus of the present embodiment.

The film forming method using the film forming apparatus 100 includes arranging a film forming target and a distribution improvement target to face a substrate (step S110, step (a)). The film forming method using the film forming apparatus 100 further includes forming a film on the substrate by sputtering the film forming target and the distribution improvement target simultaneously or alternately (step S120, step (b)). In the film forming method using the film forming apparatus 100, in step S120, a larger amount of an element that is likely to have non-uniform distribution is supplied to a portion where the distribution amount of the corresponding element is small.

Hereinafter, the second distribution improvement method for the film forming apparatus 100 of the present embodiment will be described. In the second distribution improvement method, a distribution improvement target Tc1 is prepared separately from the target T to improve the distribution. In the second distribution improvement method, the distribution improvement target Tc1 containing an element that is likely to have non-uniform distribution and having a shape in which a large amount of the element is deposited at a portion where the amount of the element is small is used separately from the target T. For example, in FIG. 4, the film formation is performed using the target T for film formation as the first target T1 and using the distribution improvement target Tc1 as the third target T3.

Figure 12:
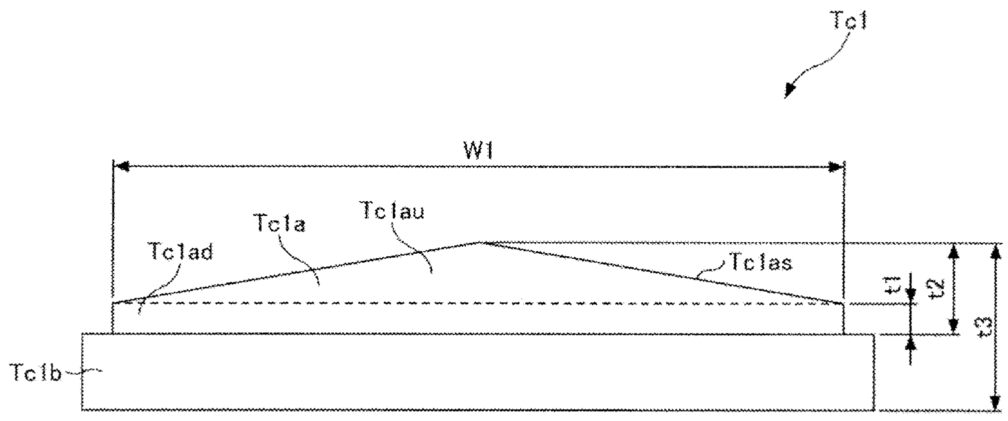
FIG. 12 explains the second distribution improvement method in an example of the film forming apparatus according to the embodiment.

Next, a case of depositing an IGZO film in the film forming apparatus 100 of the present embodiment will be described. In the case of depositing an IGZO film, the distribution improvement target Tc1 made of zinc oxide and having a shape in which a large amount of zinc is deposited on the outer periphery of the substrate W is used because the amount of zinc is insufficient at the outer periphery of the substrate W. FIG. 12 explains the distribution improvement target Tc1 used in the second distribution improvement method for the film forming apparatus 100 that is an example of the film forming apparatus of the present embodiment. FIG. 12 is a side view of the distribution improvement target Tc1 viewed in the lateral direction.

The distribution improvement target Tc1 includes a deposited film Tc1*a* made of zinc oxide, and a substrate Tc1*b* made of copper for fixing the deposited film Tc1*a*. The deposited film Tc1*a* may be referred to as "distribution improvement film."

A surface Tc1 as of the deposited film Tc1*a* in the distribution improvement target Tc1 is inclined outward in the longitudinal direction so that a large amount of zinc can be deposited on the outer periphery of the substrate W during sputtering.

The deposited film Tc1*a* has a base portion Tc1*ad* having a width W1 and a thickness t1, and an inclined portion Tc1*au* disposed on the base portion Tc1*ad* and having a triangular cross section that gradually becomes thicker from the edge toward the center in the longitudinal direction. The deposited film Tc1*a* has a thickness t2 greater than the thickness t1 at the central portion thereof. A thickness t3 is the thickness of the thickest portion of the distribution improvement target Tc1 including the substrate Tc1*b*.

For example, the width W1 may be determined within a range of 100 mm to 400 mm; the thickness t1 may be determined within a range of 1 mm to 4 mm; the thickness t2 may be determined within a range of 5 mm to 20 mm; and the thickness t3 may be determined within a range of 7 mm to 28 mm.

Since the thickness of the inclined portion Tc1*au* gradually increases toward the center in the longitudinal direction, the surface Tc1*as* of the deposited film Tc1*a* is inclined outward in the longitudinal direction. Since the surface Tc1*as* of the deposited film Tc1*a* is inclined outward in the longitudinal direction, the amount of zinc deposited on the edge of the substrate W can be increased.

In the second distribution improvement method, a uniform can be obtained by depositing a film on the substrate W using the target T and improving the element distribution using the distribution improvement target Tc1.

The distribution improvement target Tc1 is an example of the second target. The material deposited on the target T is an example of a second material. The holder 131 holding the distribution improvement target Tc1 is an example of a second holder.

<Third Distribution Improvement Method>

Next, a third distribution improvement method for the film forming apparatus 100 of the present embodiment will be described. In the third distribution improvement method, a distribution improvement target Tc2 is prepared separately from the target T to improve the distribution. In the third distribution improvement method, a shield is disposed near the distribution improvement target Tc2 containing an element that is likely to have non-uniform distribution so that a large amount of the corresponding element can be deposited on a portion where the amount of the corresponding element is small. For example, in FIG. 4, the film formation is performed using the target T for film formation as the first target T1 and using the distribution improvement target Tc2 as the third target T3.

Figure 13:
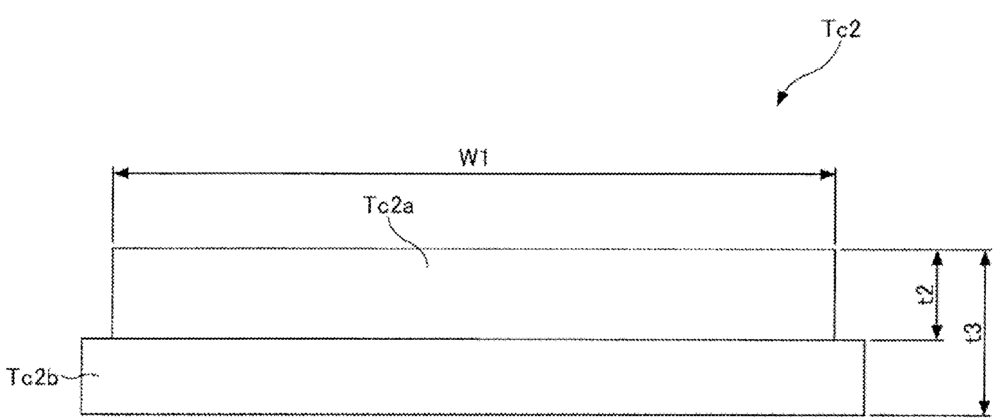
FIGS. 13 and 14 explain a third distribution improvement method in an example of the film forming apparatus according to the embodiment.
Figure 14:
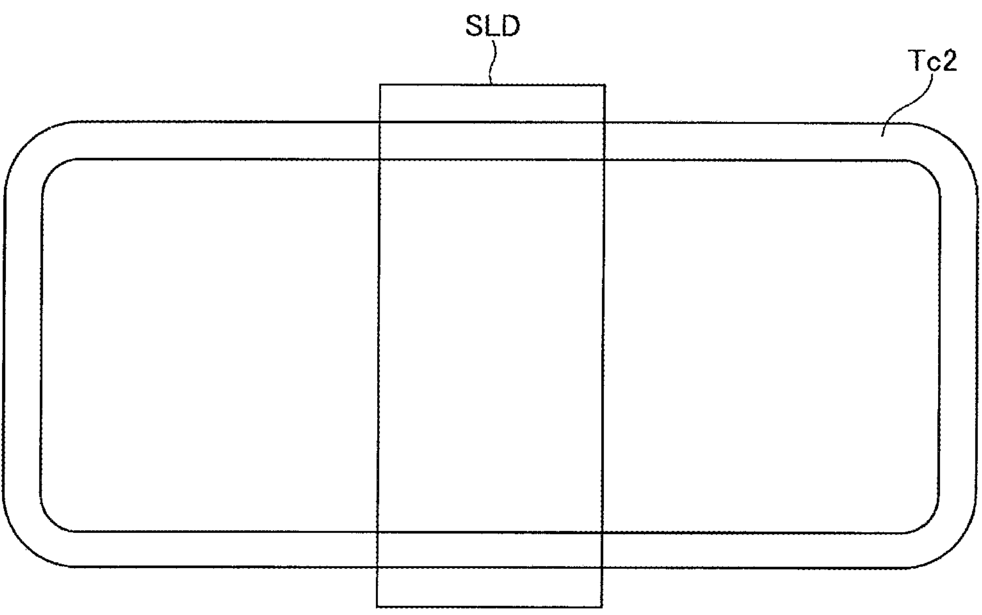

Next, a case of depositing an IGZO film in the film forming apparatus 100 of the present embodiment will be described. In the case of depositing an IGZO film, a shield SLD is used near the distribution improvement target Tc2 to deposit a large amount of zinc on the outer periphery of the substrate W because the amount of zinc is insufficient at the outer periphery of the substrate W. FIG. 13 explains the distribution improvement target Tc2 used in the third distribution improvement method for the film forming apparatus 100 that is an example of the film forming apparatus of the present embodiment. FIG. 13 is a side view of the distribution improvement target Tc2 viewed in the lateral direction. Further, FIG. 14 explains the installation position of the shield SLD used in the third distribution improvement method.

The distribution improvement target Tc2 has a deposited Tc2*a* made of zinc oxide, and a substrate Tc2*b* that is made of copper and fixes the deposited film Tc1*a*. The deposited film Tc2*a* may be referred to as "distribution improvement film."

The deposited film Tc2*a* has the width W1 and the thickness t2. The thickness t3 is the thickness of the distribution improvement target Tc2 including the substrate Tc2*b*.

The shield SLD is disposed at the central portion (near the center) of the distribution improvement target Tc2. The shield SLD is, e.g., a plate-shaped member having a large number of fine holes formed therethrough. The shield SLD partially shields the elements emitted from the distribution improvement target Tc2. Since the central portion of the distribution improvement target Tc2 is shielded by the shield SLD, a large amount of zinc can be deposited on the outer periphery of the substrate W.

In the third distribution improvement method, a uniform film can be obtained by depositing a film on the substrate W using the target T and improving the element distribution using the distribution improvement target Tc2 and the shield SLD.

<Fourth Distribution Improvement Method>

Figure 15:
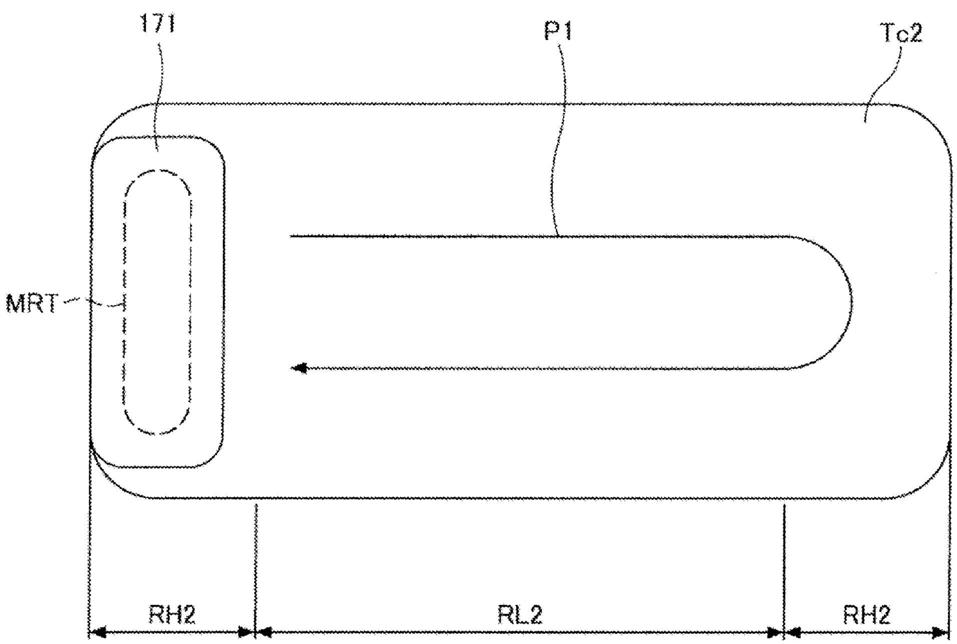
FIGS. 15 and 16 explain a fourth distribution improvement method in an example of the film forming apparatus according to the embodiment.
Figure 16:
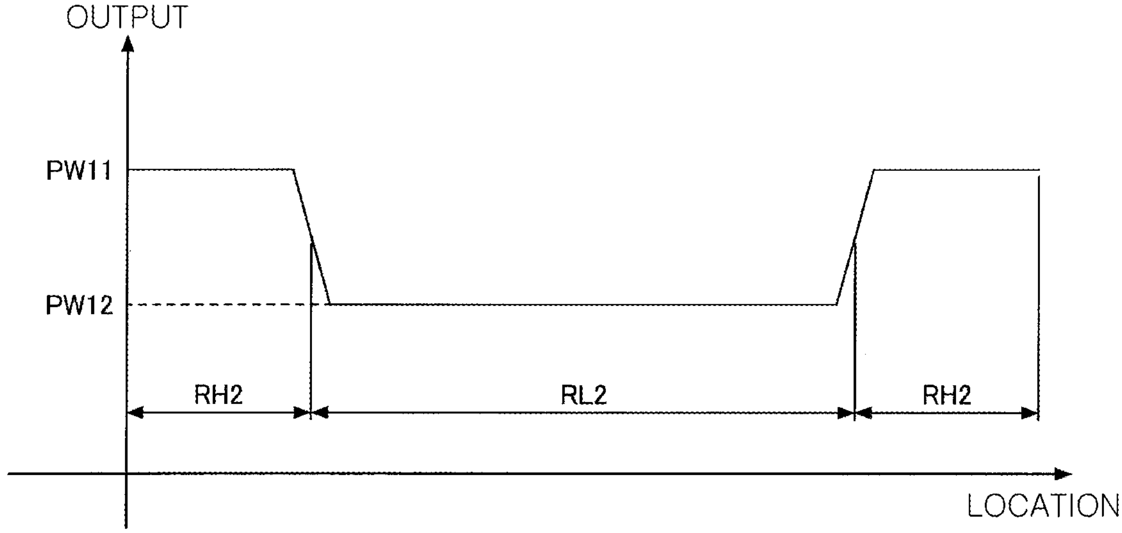

Next, a fourth distribution improvement method for the film forming apparatus 100 of the present embodiment will be described. FIGS. 15 and 16 explain the fourth distribution improvement method for the film forming apparatus 100 that is an example of the film forming apparatus of the present embodiment.

FIG. 15 explains the operation of the magnet 171 of the film forming apparatus 100. The magnet 171 of the film forming apparatus 100 reciprocates in the longitudinal direction of the distribution improvement target Tc2 on the side of the distribution improvement target Tc2 opposite to the substrate W. The magnet 171 has a magnetic field racetrack MRT. For example, in FIG. 4, the film formation is performed using the target T for film formation as the first target T1 and using the distribution improvement target Tc2 as the third target T3.

In the fourth distribution improvement method, the power supplied from the power supply 133 to the holder 131 is higher at the edge of the distribution improvement target Tc2 than at the center of the target T. Specifically, the power supplied by the power supply 133 to the holder 131 is greater in a high power region RH2 on the edge side of the distribution improvement target Tc2 than in a low power region RL2 on the center side of the distribution improvement target Tc2.

FIG. 16 explains the power supplied by the power supply 133 of the film forming apparatus 100. The power supply 133 supplies an output of a power PW12 to the holder 131 when the magnet 171 is located in the low output region RL2 on the center side of the distribution improvement target Tc2. The power supply 133 supplies an output of a power PW11 higher than the power PW12 to the holder 131 when the magnet 171 is located in the high output region RH2 on the edge side of the distribution improvement target Tc2.

In the fourth distribution improvement method, the power supplied from the power supply 133 to the holder 131 is higher at the edge of the distribution improvement target Tc2 than at the center of the target T, so that the amount of element deposited on the edge of the substrate W from the distribution improvement target Tc2 increases. Since the amount of element deposited on the edge of the substrate W from the distribution improvement target Tc2 increases, the uniformity of the film deposited on the substrate W can be improved.

<Fifth Distribution Improvement Method>

Next, a fifth distribution improvement method for the film forming apparatus 100 of the present embodiment will be described. In the fifth distribution improvement method, a distribution improvement target is prepared separately from the target T, and a shield is disposed on the substrate W side to improve the distribution.

Figure 17:
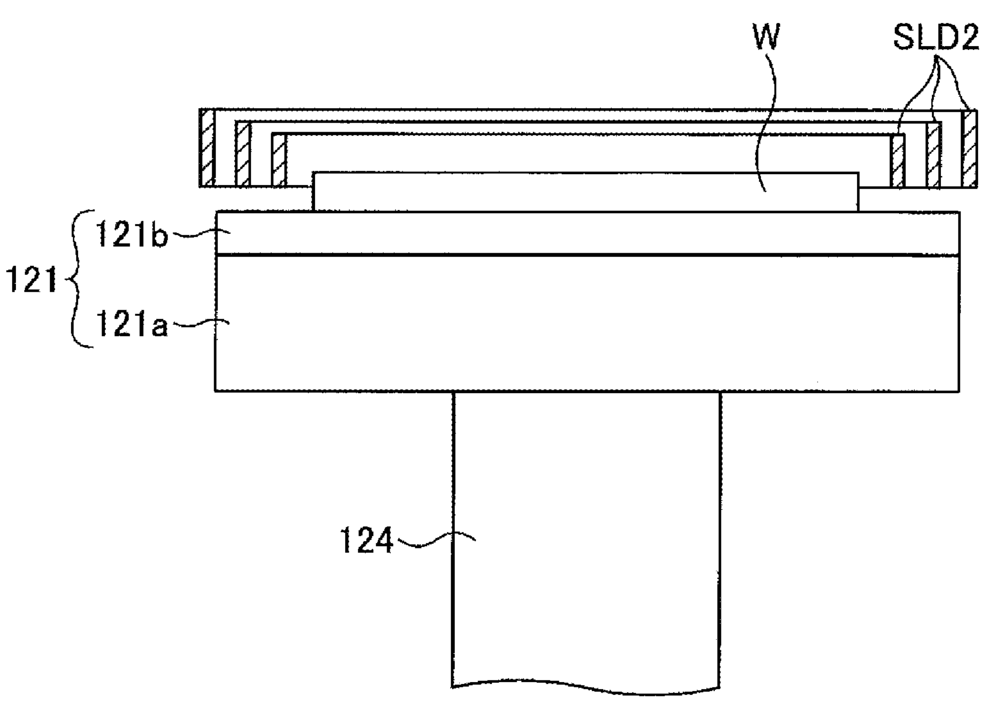
FIG. 17 explains a fifth distribution improvement method in an example of the film forming apparatus according to the embodiment.

A case of depositing an IGZO film in the film forming apparatus 100 of the present embodiment will be described. In the case of depositing an IGZO film, a shield SLD2 is used near the placement table 121 to deposit a large amount of zinc on the outer periphery of the substrate W because the amount of zinc is sufficient at the outer periphery of the substrate W. FIG. 17 explains the shield SLD2 used in the fifth distribution improvement method for the film forming apparatus 100 that is an example of the film forming apparatus of the present embodiment. For example, in FIG. 4, the film formation is performed using the target T for film formation as the first target T1 and using the distribution improvement target as the third target T3.

Since the shield SLD 2 is disposed to surround the substrate W, a large amount of zinc can be deposited on the outer periphery of the substrate W.

In the fifth distribution improvement method, a uniform film can be obtained by depositing a film on the substrate W using the target T and improving the element distribution using the distribution improvement target and the shield SLD2.

<Sixth Distribution Improvement Method>

Next, a sixth distribution improvement method for the film forming apparatus 100 of the present embodiment will be described. In the sixth distribution improvement method, a distribution improvement target is prepared separately from the target T, and a shield is disposed on the substrate W side to improve the distribution. For example, in FIG. 4, the film formation is performed using the target T for film formation as the first target T1 and using the distribution improvement target as the third target T3.

Figure 18:
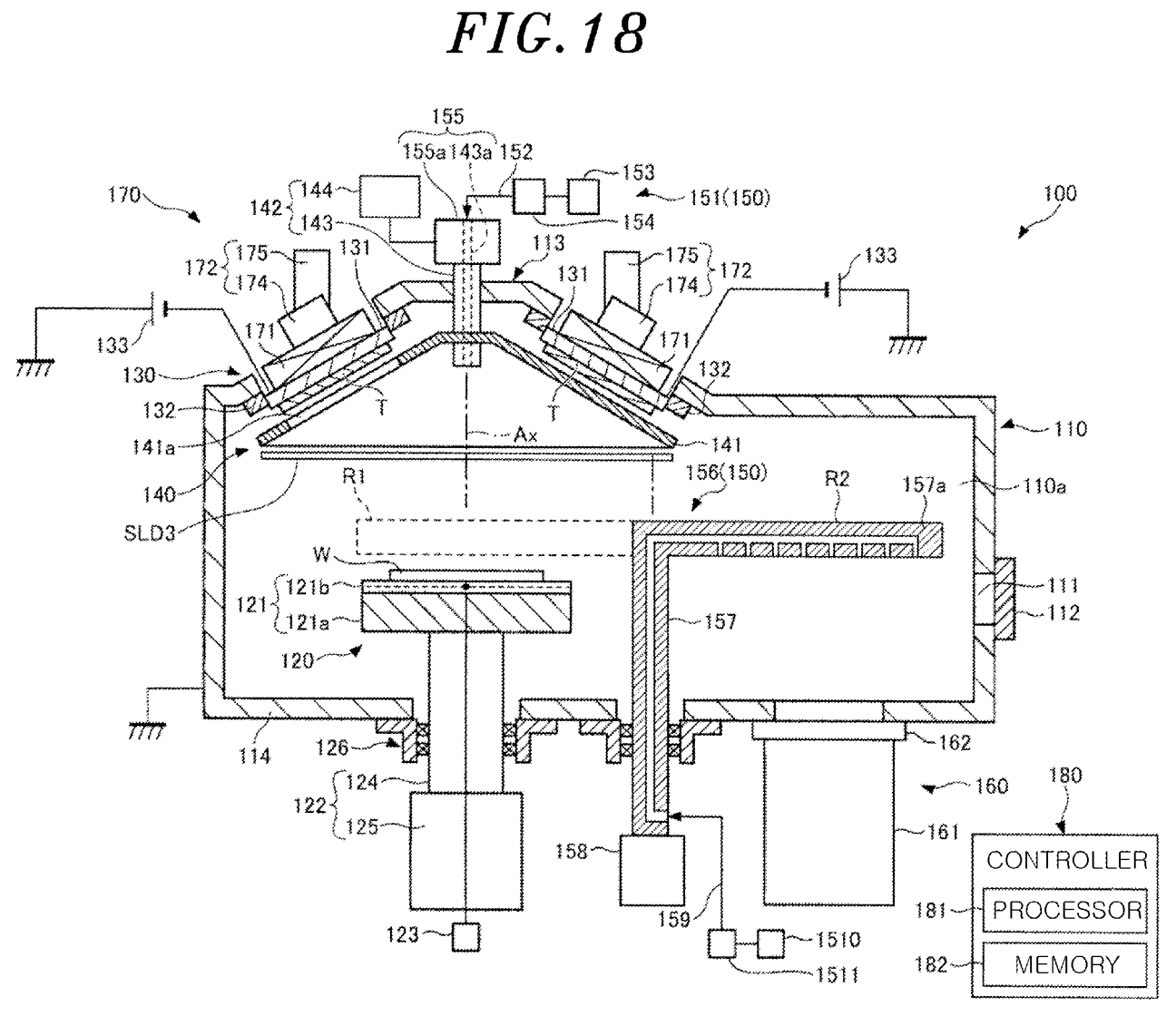
Figure 19:
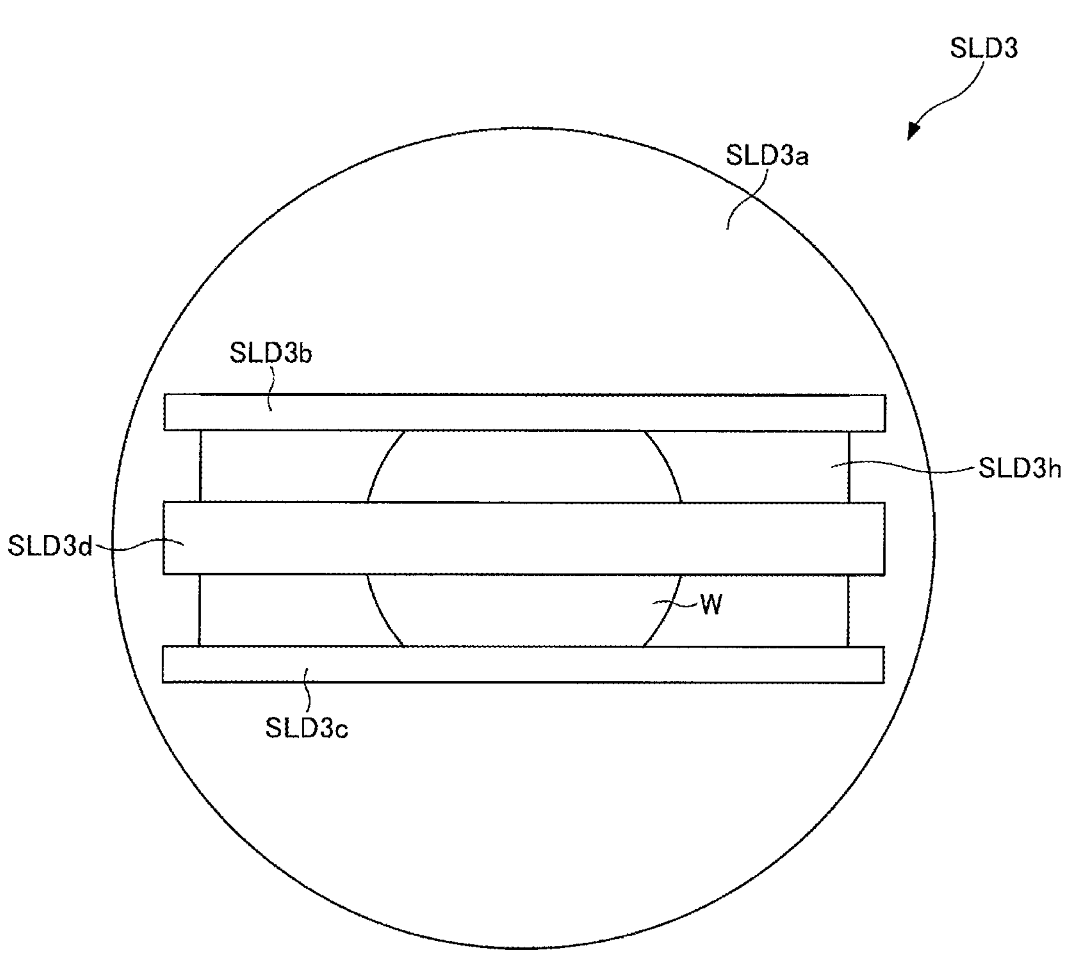

Next, a case of depositing an IGZO film in the film forming apparatus 100 of the present embodiment will be described. In the case of depositing an IGZO film, the shield SLD3 is used on the target T side in the inner space 110*a* of the processing chamber 110 to deposit a large amount of zinc on the outer periphery of the substrate W because the amount of zinc is insufficient at the outer periphery of the substrate W. FIGS. 18 and 19 explain the shield SLD3 used in the sixth distribution improvement method for the film forming apparatus 100 that is an example of the film forming apparatus of the present embodiment.

The shield SLD3 is disposed below the pyramid-shaped portion 113. The shield SLD3 has a plate-shaped shield main body SLD3*a* having an opening SLD3*h*. Elements sputtered from the target T are deposited on the substrate W through the opening SLD3*h*. The shield SLD3 includes shield plates SLD3*b*, SLD3*c*, and SLD3*d*. The shield plates SLD3*b* and SLD3*c* are disposed at the edge of the opening SLD3*h*. The shield plate SLD3*d* is disposed at the center of the opening SLD3*h*.

Since the shield SLD3 is used, a large amount of zinc can be deposited on the outer periphery of the substrate W.

In the sixth distribution improvement method, a uniform film can be obtained by depositing a film on the substrate W using the target T and improving the element distribution using the distribution improvement target and the shield SLD3.

<Seventh Distribution Improvement Method>

Next, a seventh distribution improvement method for the film forming apparatus 100 of the present embodiment will be described. In the seventh distribution improvement method, the distribution is improved by changing the speed at the time of reciprocating the magnet 171 at the distribution improvement target Tc2. For example, in FIG. 4, the film formation is performed using the target T for film formation as the first target T1 and using the distribution improvement target as the third target T3.

Next, a case of depositing an IGZO film in the film forming apparatus 100 of the present embodiment will be described. In the case of depositing an IGZO film, the magnet 171 slowly moves at the edge of the distribution improvement target Tc2 to deposit a large amount of zinc on the outer periphery of the substrate W because the amount of zinc is insufficient at the outer periphery of the substrate W.

Figure 20:
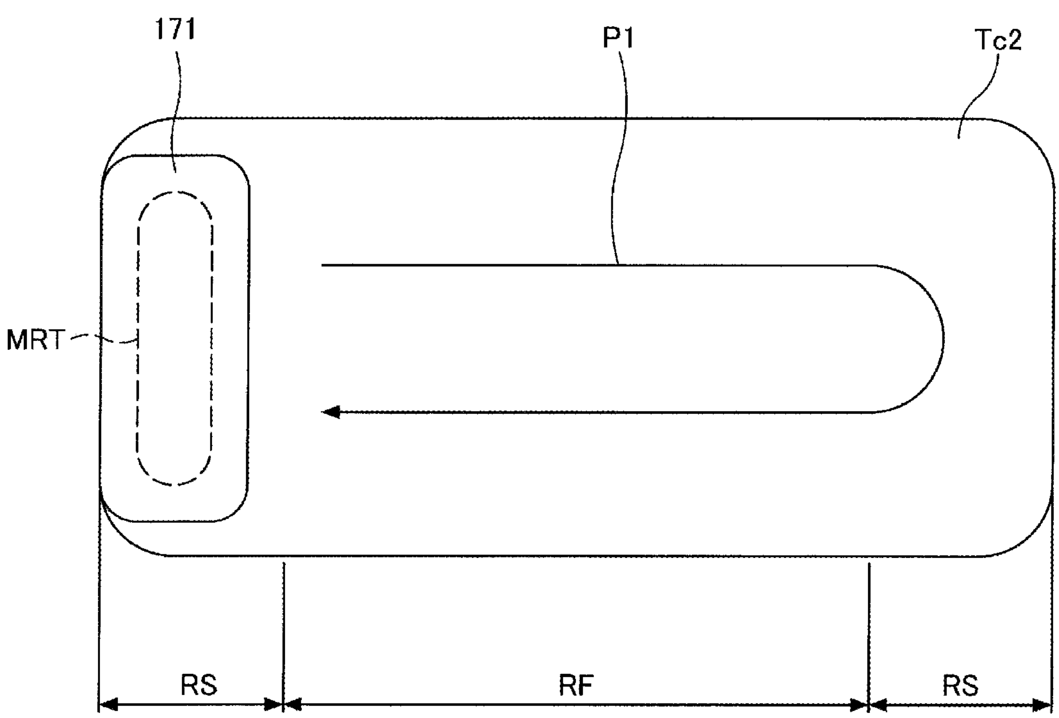
FIG. 20 explains a seventh distribution improvement method in an example of the film forming apparatus according to the embodiment.

FIG. 20 explains a seventh distribution improvement method for the film forming apparatus 100 that is an example of the film forming apparatus of the present embodiment.

In the film forming apparatus 100, the magnet 171 slowly moves in a low speed region RS on the edge side of the distribution improvement target Tc2. On the other hand, in the film forming apparatus 100, the magnet 171 quickly moves in a high speed region RF on the center side of the distribution improvement target Tc2.

Since the magnet 171 slowly moves in the low speed region RS on the edge side of the distribution improvement target Tc2 and quickly moves in the high speed region RF on the center side of the distribution improvement target Tc2, a large amount of zinc can be deposited on the outer periphery of the substrate W.

In the seventh distribution improvement method, a uniform film can be obtained by depositing a film on the substrate W using the target T and by improving the element distribution by moving the magnet 171 in a predetermined manner using the distribution improvement target.

OPERATION AND EFFECT

In accordance with the film forming method and the film forming apparatus of the present disclosure, a plurality of elements contained in the alloy target may have uniform in-plane distribution.

Although the case of forming an alloy film (IGZO film) containing indium, gallium, zinc, and oxygen has been described, a film to be formed is not limited to an alloy film (IGZO film) containing indium, gallium, zinc, and oxygen. In the case of simultaneously sputtering multiple types of elements, if the angle distribution of elements emitted from the target varies depending on the elements, the film forming apparatus of the present disclosure may be applied. For example, the film forming apparatus of the present disclosure may be used in the case of forming a tungsten film and a silicon film.

The film forming method and the film forming apparatus according to the embodiments of the present disclosure are considered to be illustrative in all respects and not restrictive. The above-described embodiments can be changed and modified in various forms without departing from the scope of the appended claims and the gist thereof. The above-described embodiments may include other configurations without contradicting each other and may be combined without contradicting each other.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for forming a film including an alloy film on a surface of a substrate using a film forming target made of the alloy film, wherein the alloy film contains multiple kinds of elements including a first element, the film forming method comprising steps of:

(a) arranging the film forming target and a distribution improvement target to face the substrate; and (b) forming the film on the substrate by simultaneously or alternately sputtering the film forming target and the distribution improvement target, wherein the distribution improvement target is made of a distribution improvement film containing the first element, wherein the first element is a metal element and is non-uniformly distributed on the surface of the substrate, among the multiple kinds of elements, when the film is formed on the substrate by the film forming target, in the step (b), a larger amount of the first element sputtered from the distribution improvement target is supplied to an outer periphery portion of the substrate where a distribution amount of the first element sputtered from the film forming target is less than other portions of the substrate when the film is formed on the substrate by sputtering the film forming target, and the step (b) includes:

moving a magnet disposed on a side of the film forming target opposite to the substrate in a longitudinal direction of the film forming target, and controlling a power supply, which supplies a power to a holder configured to hold the film forming target, to supply a first power to the holder when the magnet is located at an edge of the film forming target in the longitudinal direction and a second power to the holder when the magnet is located at a center of the film forming target to supply a larger amount of the first element to the outer periphery portion of the substrate, wherein a ratio of the second power to the first power is 0.5.

2. The film forming method of claim 1, wherein the distribution improvement target has a shape that gradually thickens from an edge toward a center in a longitudinal direction.

3. The film forming method of claim 1, wherein a shield is disposed near a center of the distribution improvement target.

4. The film forming method of claim 1, wherein a shield is disposed near an edge of the substrate.

5. The film forming method of claim 1, wherein a magnet is disposed on a side of the distribution improvement target opposite to the substrate, and in the step (b), the magnet moves slower when the magnet is located at an edge of the distribution improvement target in a longitudinal direction than when the magnet is located at a center of the distribution improvement target in the longitudinal direction.

6. The film forming method of claim 1, wherein the alloy film contains indium, gallium, zinc and oxygen.

7. The film forming method of claim 6, wherein the distribution improvement film contains zinc oxide.

* * * * *